United States Patent [19]

Appelt et al.

[11] Patent Number: 4,479,983

[45] Date of Patent: Oct. 30, 1984

[54] METHOD AND COMPOSITION FOR APPLYING COATINGS ON PRINTED CIRCUIT BOARDS

[75] Inventors: Bernd K. Appelt, Apalachin; George P. Schmitt, Vestal; John F. Shipley, Endwell, all of N.Y.

[73] Assignee: International Business Machine Corporation, Armonk, N.Y.

[21] Appl. No.: 456,231

[22] Filed: Jan. 7, 1983

[51] Int. Cl.$^3$ .............................................. B05D 3/06
[52] U.S. Cl. .................. 427/54.1; 204/159.16; 427/96; 427/282
[58] Field of Search .................. 427/54.1, 44, 96, 282; 204/159.16

[56] References Cited

U.S. PATENT DOCUMENTS 4,074,008 2/1978 Green ..................................... 427/96
4,169,732 10/1979 Shipley ................................. 427/96
4,208,005 6/1980 Nate et al. ........................... 427/96
4,292,230 9/1981 Kenney et al. ....................... 523/443

Primary Examiner—John H. Newsome
Attorney, Agent, or Firm—Mark Levy; Elmer W. Galbi

[57] ABSTRACT

A coating is produced by a method including a screen printing of a photopolymerizable composition on a printed circuit board, illuminating said composition to partially polymerize it and bake it to complete the polymerization.

The composition used by said method contains a reaction product of a monoethylenically unsaturated carboxylic acid with a material of the group of epoxy resin and epoxidized novolak, a phenoxy resin, a thickening agent, a polyethylenically unsaturated compound, a photo-initiator and a solvent.

The coating produced according to this invention is used as solder mask.

25 Claims, No Drawings

METHOD AND COMPOSITION FOR APPLYING COATINGS ON PRINTED CIRCUIT BOARDS

The invention relates to a method for applying coatings by screen printing on printed circuit boards and by a subsequent baking cycle and to a screenable composition that is transformed into the coating by said method.

BACKGROUND OF THE INVENTION

In the fabrication of high quality printed circuit boards, it is necessary to coat the substrate with a tough, resistant coating in selected areas which serves as a solder mask. In high quality printed circuit boards, molten solder is used to insure good interconnection between the components and the circuitry.

The coating to be used for such applications must possess a number of important characteristics. In particular, the coatings must be strongly adherent to a wide variety of metallic and non-metallic substrates, and resistant to harsh environmental conditions such as high humidity and elevated temperatures. The coatings also must be impervious to a wide variety of solvents, resistant to a large number of different chemicals, and particularly be resistant to commonly-used flux compositions and solders.

Moreover, since it is preferred that the solder masks remain on the circuitry as a protective coating, such must possess electrical insulating properties which last over long periods of time. Also the coatings must be durable and possess the above properties even after long periods of exposure to a wide variety of chemicals and adverse environmental conditions. The solder masks are left on the circuitry in order to protect it from oxidation and from the adverse effects of such gases as sulfur dioxide, hydrogen sulfide and chlorine.

The compositions used in producing these coatings, to be used in screen printing processes, must also be capable of good pattern definition which is dependent to a large extent upon the flow characteristics of the composition. Basically, the screen printing technique involves squeezing a composition through the open meshes of a streched piece of material such as wire onto a printable substrate. The screen is covered or blocked out in part by a masking material in order to form the desired pattern on the printable substrate. The masking material may simply be a stencil or a dried lacquer, shellac or glue. Once the screen has been covered or blocked out in part by a masking material, it is held taut on a frame and positioned over the desired substrate. The coating composition is then poured onto the screen and squeezed through the open areas with a squeegee. Thereafter, the frame is removed and the coated substrate baked. It is important, when following a desired pattern, that the composition do not flow or bleed outside of the preselected areas defined by the open areas of the screen but should follow accurately the image formed on the screen and reproduce it.

These known techniques to produce these coatings are described for example in U.S. Pat. No. 4,292,230 and GE-OS No. 22 36 928.

Screen applied solder masks formed using these known techniques do not hold the exact image during the bake cycle, because a very thin film of the above coating composition exudes from the bulk coating at the baking temperature and spreads or bleeds into window areas. While this exudation is tolerable with conventional printed circuit boards it in unacceptable with high density printed circuit boards because there said exudation can cause poor solderability.

It is therefore the object of the invention to find a way for producing coatings that serve as solder masks on printed circuit boards, where the bleeding in during the baking cycle is inhibited.

It is another object of this invention to produce a coating that has the advantages of the prior art coatings.

It is still another object of the invention to provide a method that is compatible to a large extent with the known methods and affords only minor additional apparative and procedural expenses.

SUMMARY OF THE INVENTION

The above objects are achieved by a method as defined at the beginning of this specification and by a photopolymerizable composition used by said method, wherein said composition being screen applied to the printed circuit board is blanket exposed to UV-light prior to the baking cycle, and wherein said composition consists of a reaction product of a monoethylenically unsaturated carboxylic acid with a material of the group epoxy resin and epoxidized novolak, a phenoxy resin, a thickening agent, a polyethylenically unsaturated compound, a photoinitiator and a solvent.

Photopolymerizable compositions used to produce solder masks for printed circuit boards are described in U.S. Pat. No. 4,169,732. However, due to their low viscosity these compositions are not suitable for screen printing. In addition the U.S. patent does not suggest the use of the known composition to prevent bleed-in during the baking cycle. Screen applied, UV curable coatings are known however, they do not offer the pattern resolution, necessary for high density printed circuit board or the adhesion and thermal stability required in the subsequent soldering operations. Further the chemistry is usually based on acrylic polymers rather than on epoxy resins and are therefore not chemically compatible with known printed circuit board technologies.

The advantages of the inventive method and the inventive composition include:

1. Increased resolution in that exudation is eliminated.
2. Increased production volume in that board rework and scrap due to exudation is eliminated.
3. The inventive method allows to transport the boards through the furnace at a higher temperature and therefore at a higher rate than with the known methods, nor does the inventive method need a programmable, sophisticated furnace.
4. Differently from the known methods *both* sides of the boards can be coated (and exposed) prior to the baking step. This increases throughput and decreases thermal exposure of the boards and its handling in comparison to the known methods.
5. Reduced dependence on incoming material characterization, may eliminate the need to measure molecular weight parameters of epoxide resin or epoxidized novolac to be used in coating due to UV polymerization concept.
6. Coated boards are completely inspectable after actinic radiation prior to thermal cure wherein defectively coated boards may be reclaimed. This condition does not exist with the known methods where inspection is only available after thermal cure at which time boards are not reclaimable.
7. Less solvent is required in coating formulation which provides for a longer working life of the composition.

Advantageous embodiments of the inventive method and the inventive composition are disclosed in the subclaims.

DESCRIPTION OF PREFERRED EMBODIMENT

The invention will become more apparent from the following detailed description.

A first preferred composition consists of the reaction product of an α, β-ethylenically unsaturated carboxylic acid with an epoxy resin, a phenoxy resin, a thickening agent, a polyethylenically unsaturated compound, a photo-initiator and a solvent. In a second preferred composition the epoxy resin is replaced by an epoxidized novolak. In addition the compositions may contain a anhydride of a dicarboxylic acid.

The reaction product of a monoethylenically unsaturated carboxylic acid with an epoxy resin or an epoxidized novolak provides in combination with the other constituents a photo-processable composition which not only exhibits good resolution (e.g. sharply defined acuity) but also possesses excelllent film forming properties such as good flexibility and toughness.

Suitable α, β-ethylenically unsaturated carboxylic acids are acrylic acid, methacrylic acid and crotonic acid.

The epoxy resin is a bisphenol A-epichlorhydrin epoxy polymer having the general formula

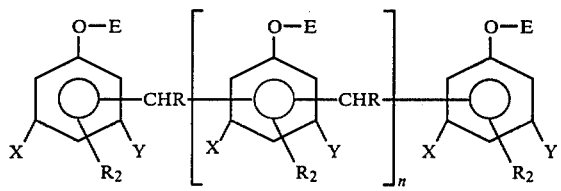

A commercially available epoxy resin of said type is e.g. Epon Resin 1004.

The epoxidized novolak is represented by the formula:

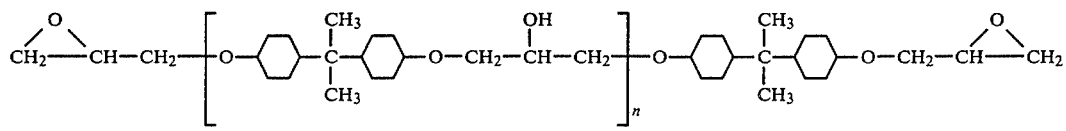

where E is hydrogen or an epoxyalkyl group with at least two E groups per polymer molecule being an epoxyalkyl group, and R is hydrogen or alkyl and Y, X are hydrogen chlorine, alkyl or hydroxyl. A discussion of some suitable novolak polymers can be found in a publication by Dow entitled "Dow epoxy novolac resins", 1972, Form No. 190-20-72.

Since the epoxy polymers of the bisphenol A-epichlorhydrine type are relatively low molecular weight relatively high molecular weight polymer is added to the composition in order to assist in obtaining a good pattern resolution and to provide increased smoothness of the final film. These relatively high molecular weight polymers include phenoxy resins. Phenoxy resins are a thermoplastic polyhydroxy ether being represented by the repeating unit

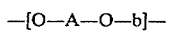

where A is the radical residuum of a polynuclear dihydric phenol and B is an hydroxyl-containing radical residuum of epichlorohydrin. The preferred phenoxy resin are those where the dihydric phenol is bisphenol A and can be represented by having the repeated unit:

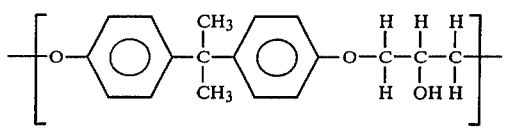

Some commercially available phenoxy polymers or resins include Eponol 53, Eponol 55 and Epon 1009 from Shell Chem. Co. and Phenoxy PAHJ, Phenoxy PKHC, Phenoxy PKHA and Phenoxy PKHH from Union Carbide.

Anhydrides of a dicarboxylic acid that may be contained in the composition serve as a curing agent for the epoxy resin or the epoxidized novolak respectively and also as a diluent to facilitate and achieve the proper flow characteristic of the composition. Examples of some suitable anhydrides include: dodecenyl succinic anhydride, and preferably nadic methyl anhydride.

Another essential constituent of the compositions of the present invention is a thickening agent which preferably consists of colloidal silica. Colloidal silica is silica having a surface area of about 50 to about 500 m²/gram (determined by the BET nitrogen adsorption method) with particles having diameters from about 5 to about 20 millimicrons. Colloidal silica, used according to the present invention, is preferably fused silica gel or fumed silicon dioxide as it is sometimes called. In addition, the colloidal silica is often referred to in the art as silica aerogel. Fused silica is obtained by the hydrolysis or combustion of silicon tetrachloride in hydrogen-oxygen furnaces. Examples of some commercially available colloidal silicas include Cab-O-Sil and Santocel.

The polyethylenically unsaturated compounds employed in the compositions of the present invention must be capable of reacting upon exposure to ultraviolet light and should contain terminal ethylenic groups. Such compounds include unsaturated esters of polyols and especially esters of an unsaturated carboxylic acid such as ethylene glycol diacrylate; diethylene glycol diacrylate; glycerol diacrylate; glycerol triacrylate; ethylene glycol dimethacrylate; 1,3-propylenediol dimethacrylate; 1,2,4-butane triol trimethacrylate; 1,4-benzenediol dimethacrylate; 1,4-benzenediol dimethacrylate; pentaerythritol tetramethacrylate; 1,3-propane diol diacrylate; 1,6-hexane diol diacrylate; the bis-acrylate and methacrylates of polyethylene glycols of molecular weight 200–500; trimethylol propane triacrylate; pentaerythritol triacrylate; unsaturated amides such as those of the unsaturated carboxylic acids and especially those of alpha, omega-diamines and oxygen-interrupted omega-diamines such as methylene bisacryl and bismethacrylamide; diethylene triamine tris-methacrylamide; bis-(methacrylamidopropoxy) ethane; bis-methacrylamidoethyl methacrylate N-[(β-hydroxyethyloxy)ethyl]acrylamide; vinyl-esters such as divinyl succinate; divinyl adipate; divinyl phthalate, divinyl terephthalate, divinyl benzene-1,3-disulfonate, and divinyl butane-1,4-disulfonate; and unsaturated aldehydes such as sorbaldehyde.

The preferred polyethylenically unsaturated compounds include the polyethylene glycoldiacrylates and trimethylol propane triacrylate.

The compositions of the present invention further include a photo-initiator or sensitizer. Many such materials are well known to the prior art. Examples of some suitable photo-initiators include anthraquinone and substituted anthraquinones such as the alkyl substituted or halo substituted anthraquinones including 2-tert-butylanthraquinone, 1-chloro-anthraquinone; p-chloroanthraquinone, 2-methylanthraquinone, 2-ethylanthraquinone and octamethylanthraquinone; other substituted or unsubstituted polynuclear quinones including 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetra-hydronaphtacenequinone, 1,2,3,4-tetrahydrobenzantracene-7,12-dione. Other photosensitizers include halogen-type sensitizers such as carbontetrachloride, bromoform and carbontribromide; benzotriazole, benzoin, chloranil, benzil, diacetyl, 5-nitrosalicylaldehyde, 2,4-dinitrotoluene. Mixtures of photo-initiators can be employed when desired. The preferred photo-initiators include the anthraquinones such as tert.-butyl anthraquinone.

The solvent is selected so that it has a suitable volatility and is capable of dissolving the solid materials of the composition. The volatility should be selected so that it has proper flow characteristics and is not too fast of an evaporating material so as to minimize the formation of bubbles in the coated article. Examples of some suitable solvents include the mono ethers of ethylene glycol as well as certain of their derivatives such as those which are commercially available under the trade designations carbitol and cellosolve, like for example ethyleneglycolmonoethyl ether acetate which is known under the trade designation cellosolve acetate and also methyl ethyl ketone which is an example of a fast evaporating solvent and butylcarbitol which is an example of a slower evaporating solvent. Mixtures of solvents can be employed when desired.

The composition percentages depend on parameters like the viscosity desired for screening, on the UV cure-rate, and the desired hardness and thickness of the coating to be produced.

The preferred amounts of the constituents in the first preferred composition are: between about 20 and about 50% by weight acrylated epoxy resin, with about 50 to about 100% of the epoxy functions being acrylated, between about 28 and about 48% by weight phenoxy resin, between about 2 and about 6% by weight colloidal silica (Cab-O-Sil), between about 5 and about 15% by weight trimethylol propane triacrylate (TMPTA), between about 0.5 and about 1.5% by weight tert-butylanthraquinone (TBA), with the rest consisting of solvent, like cellosolve acetate. The best results are obtained with a composition containing about 30% by weight of acrylated epoxy resin with about 75% of the epoxy functions being acrylated, about 38% by weight phenoxy resin, about 3% by weight Cab-O-Sil, about 8% TMPTA, about 0.5% by weight TBA and about 20,5% by weight solvent.

The preferred amounts of the constituents in the second preferred composition are: between about 31 and about 55% by weight of acrylated epoxidized novolak with about 50 to about 100% of the epoxy functions being acrylated, between about 5 and about 11% by weight phenoxy resin, between about 14 and about 20% by weight of a liquid anhydride of carboxylic acid, between about 4 to about 5.5% by weight of Cab-O-Sil, between about 4 and about 14% by weight of TMPTA, and between about 0.5 and about 1.5% by weight of TBA with the rest consisting of solvent, like cellosolve acetate and methyl ethyl ketone (MEK).

The best results are obtained with a composition containing about 42% by weight of acrylated epoxidized novolak with about 75% of the epoxy functions being acrylated, about 8% by weight of phenoxy resin, about 15.5% by weight of nadic methyl anhydride, about 4.5% by weight of Cab-O-Sil, about 8% by weight of TMPTA, about 1% by weight of TBA and about 21% by weight of solvent.

The reaction between the epoxy resin or the epoxidized novolak respectively which are dissolved in a solvent, like methyl ethyl ketone (MEK) or cellosolve acetate, the $\alpha,\beta$-ethylenically unsaturated carboxylic acid and a catalyst, like benzyl dimethyl amine (BDMA) or zinc octoate, takes place at a temperature of about 65° C. for about 24 hours. The relative amounts of monoethylenically unsaturated acid are sufficient to react stoichiometrically with about 50 to about 100% and preferably about 50 to about 75% of the epoxide functionality of the epoxy resin or the epoxidized novolak respectively. The higher the amount of acid, the better the resultant toughness of the film on exposure to UV light.

The product of the above reaction together with the phenoxy resin and if desired an anhydride of a dicarboxylic acid can be diluted further with the solvent. The solution is put into a high speed mixer of the planetary mixer type. The polyethylenically unsaturated compound and the photoinitiator are added and finally the thickening agent is sheared in. The composition is mixed employing high speed stirring. The stirring is continued until the thickening agent has been fully blended into the composition, which usually requires about 15 to about 20 minutes of stirring. The finished composition has a viscosity of about 14,000 to about 50,000 and preferably about 20,000 to about 50,000 centipoises. The viscosity is determined with a Haake Rotovisco with a shear rate of 249.6/sec for 1.28 minutes at 25° C.

The above composition is coated in a predetermined pattern onto one side of a printed circuit board to a thickness of about 50.8 $\mu$m employing a screen coating technique using a 120 mesh wire screen. The applied coating is blanket exposed to actinic radiation with UV light. This actinic radiation solidifies the coating components through UV polymerization to an immovable solid. The polymerization by addition reaction chemistry increases the molecular weight of monomeric units to a three dimensional network, which during subsequent thermal cure inhibits exudation from the bulk resin. For the radiation typically a high pressure short arc mercury lamp with a 20 minutes intensity of between 1.25 and 5 watts/cm$^2$ of the coating surface is used. Then the other side of the printed circuit panel is coated in a a predetermined pattern with the above composition to a thickness of about 50.8 μm employing a screen coating technique using the same mesh wire screen as above and exposed to UV light as above. Both sides of the coated board are then cured by exposure to a temperature of about 150° C. for about 40 minutes.

The applied coating has—as shown by a peel test—an excellent adhesion to the underlying printed circuit board and an excellent pattern resolution. The results obtained are reproducible within very small tolerances.

The following two examples serve to illustrate preferred embodiments of the invention and are not intended to limit the teachings as set forth herein.

EXAMPLE 1

To a solution of 300 parts by weight of EPON Resin 1004 in cellosolve acetate 54 parts by weight of acrylic acid are added. The mixture is allowed to react at about 65° C. for about 24 hours. The reaction product is mixed with 380 parts by weight of PKHC in the form of a 29.5% solution in cellosolve acetate with 80 parts by weight of TMPTA and 5 parts by weight of TBA. To the composition contained in a high speed mixer 30 parts by weight of Cab-O-Sil are sheared in. Employing high speed stirring the composition is mixed until the Cab-O-Sil has been fully dispersed into the composition.

The above composition is coated in a hole-matrix type pattern on the one side of a printed circuit board employing a screen coating technique using a 120 mesh wire screen. The applied coating is blanket exposed using a high pressure short arc mercury lamp, like the Model HBO of Osram GmbH Germany, with an intensity of about 3 watts/cm$^2$ of the coating surface. Subsequently the other side of the board is processed in the same manner.

Both sides of the printed circuit board are then cured by exposure to a temperature of about 150° C. for about 40 minutes.

The coating had a strong adhesion to the printed circuit board, the fidelity of the production of the intended pattern in the coating was excellent, and the coating was resistant against the 220° C. hot air in the soldering furnace and also to a 200° C. hot soldering well, as shown by tests with printed circuit cards to which a coating according to the present invention had been applied.

EXAMPLE 2

To a solution of 300 parts by weight of an epoxidized novolak available under the trade designation DEN439 in cellosolve acetate 54 parts by weight of acrylic acid are added. The mixture is allowed to react at about 65° C. for about 24 hours. The reaction product is mixed in a high speed mixer with 67 parts by weight of PKHC in the form of a 29.5% solution in cellosolve acetate, with 130 parts by weight of nadic methyl anhydride (NMA), with 67 parts by weight of TMPTA and with 8 parts by weight of TBA. 38 parts by weight of Cab-O-Sil are sheared into the composition. Employing high speed stirring the composition is mixed until the Cab-O-Sil has been fully dispersed into the composition.

The composition is coated, exposed to radiation and cured as described in example 1. The results obtained are comparably favorable as in example 1.

While the invention has been particularly shown and described with reference to the embodiments thereof, it will be understood by those skilled in the art that the foregoing and other changes in form and detail may be made therein without departing from the spirit and scope of the invention.

We claim:

1. Method of forming a solder mask on a high density printed circuit board comprising:
    (a) preparing a photopolymerizable composition consisting of a phenoxy resin, a thickening agent, a polyethylenically unsaturated compound, a photoinitiator, a solvent, and a reaction product of a monoethylenically unsaturated carboxylic acid with a material of the group consisting of bisphenol A-based epoxy resins and epoxidized novolaks, and wherein the ingredients are mixed according to the viscosity of the composition required for a desired screenability and curability of said composition, and the desired thickness and hardness of the solder mask to be produced,
    (b) screen printing said photopolymerizable composition onto a printed circuit board,
    (c) blanket illuminating said applied composition in order to partially polymerize it to at least the point at which bleeding in of said applied composition is inhibited and resolution is retained, and
    (d) baking said applied composition to complete the polymerization.

2. Method according to claim 1, wherein said coating is prepared from a composition consisting of a reaction product of a monoethylenically unsaturated carboxylic acid with a material of the group epoxy resin and epoxidized novolak, a phenoxy resin, a thickening agent, a polyethylenically unsaturated compound, a photoinitiator and a solvent, and wherein the ingredients are mixed according to the viscosity of the composition required for a desired screenability, and the curability of the composition, and the desired thickness and hardness of the coating to be produced.

3. Method according to claim 2, wherein as thickening agent colloidal silica, as polyethylenically unsaturated compound tri-methylolpropane tri-acrylate (TMPTA), as photoinitator tert-butylanthraquinone (TBA), as mono ethylenically unsaturated carboxylic acid acrylic acid and as solvent cellosolve acetate are used.

4. Method according to claim 3, wherein an anhydride of a dicarboxylic acid is added to the screenable composition.

5. Method according to claim 4, wherein said composition is mixed of between about 20 to about 50% by weight of acrylated epoxy resin, between about 28 to about 48% by weight of phenoxy resin, between about 2 and about 6% by weight of colloidal silica, between about 5 and about 15% by weight of TMPTA, and between about 0.5 and about 1.5% by weight of TBA, with the rest consisting of solvent.

6. Method according to claim 5, wherein said composition is mixed of about 30% by weight of an acrylated epoxy resin, about 38% by weight of a phenoxy resin, about 3% by weight of Cab-O-Sil, about 8% by weight of TMPTA, about 0.5% by weight of TBA and about 20,5% by weight of a solvent.

7. Method according to claim 4, wherein said composition is mixed of between about 31 and about 55% by weight of an acrylated epoxidized novolak, between about 5 and about 11% by weight of a phenoxy resin, between about 14 and about 20% by weight of nadic methyl anhydride as liquid anhydride of a carboxylic acid, between about 4 and about 5.5% by weight of colloidal silica, between about 4 and about 12% by weight of TMPTA, and between about 0.5 to about 1.5% by weight of TBA, with the rest consisting of solvent.

8. Method according to claim 7, wherein said composition is mixed of about 42% by weight of acrylated epoxidized novolak, about 8% by weight of phenoxy resin, about 15.5% by weight of nadic methyl anhydride, about 4.5% by weight of colloidal silica, about 8% by weight of TMPTA, about 1% by weight of TBA and about 21% by weight of solvent.

9. Method according to claim 8, wherein said material of the group of epoxy resin and epoxidized novolak is dissolved in a solvent and combined with the monoethylenically unsaturated carboxylic acid, wherein the two compounds are allowed to react at about 65° C. for about 24 hours, wherein the reaction product is combined with a premix of the phenoxy resin, TMPTA and TBA and wherein the colloidal silica is sheared into the mixture and wherein the produced composition is screen printed onto said printed circuit board.

10. Method according to claim 9, wherein the relative amount of the acrylic acid to the epoxy resin or the epoxidized novolak respectively is sufficient to react stoichiometrically with about 50 to about 75% of the epoxide functionality of this epoxy resin or this epoxidized novolak respectively.

11. Method according to claim 10, wherein the applied coating is illuminated with UV light having an intensity of 1.25 to 5 watts/cm$^2$ of the coating surface.

12. Method according to claim 11, wherein said coating is baked at temperatures between about 100° and about 180° C. for about 20 to about 40 minutes.

13. Method according to claim 12, wherein the coating is illuminated with an intensity of about 3 watts/cm$^2$ of the coating surface and baked at a temperature of about 140° C. for about 30 minutes.

14. Composition for producing coatings on printed circuit boards consisting of a phenoxy resin, a thickening agent, a polyethylenically unsaturated compound, a photoinitiator, a solvent and a reaction product of a monoethylenically unsaturated carboxylic acid with a material of the group consisting of bis-phenol A-based epoxy resins and epoxidized novolaks.

15. Composition according to claim 14, wherein said thickening agent is colloidal silica, said polyethylenically unsaturated compound is tri-methyl propane triacrylate (TMPTA), said photoinitiator is tert.-butyl anthraquinone (TBA), said monoethylenically unsaturated compound is acrylic acid and said solvent is cellosolve acetate, methyl ethyl ketone or butyl carbitol.

16. Composition according to claim 15, also containing an anhydride of a dicarboxylic acid.

17. Composition according to claim 16, wherein said monoethylenically unsaturated carboxylic acid is selected from the group of acrylic acid, methacrylic acid and crotonic acid.

18. Composition according to claim 17, wherein the relative amounts of monoethylenically unsaturated acid to the epoxy resin or the epoxidized novolak respectively is sufficient to react stoichiometrically with about 50 to about 100% of the epoxide functionality of this epoxy resin or this epoxidized novolak respectively.

19. Composition according to claim 18, wherein the relative amount of monoethylenically unsaturated acid to said epoxy resin or said epoxidized novolak respectively is sufficient to react with about 75% of the epoxide functionality of said epoxy resin or said epoxidized novolak respectively.

20. Composition according to claim 19, wherein the composition contains between about 20 and about 50% by weight of acrylated epoxy resin, between about 28 and about 48% by weight of phenoxy resin, between about 2 and about 6% by weight of colloidal silica, between about 5 and about 15% by weight of TMPTA, and between about 0.5 and 1.5% by weight of TBA with the rest consisting of solvent.

21. Composition according to claim 20, containing about 30% by weight of acrylated epoxy resin, about 38% by weight of phenoxy resin, about 3% by weight of colloidal silica, about 8% by weight of TMPTA, about 0.5% by weight of TBA and about 20.5% by weight of solvent.

22. Composition according to claim 21, containing between about 31 and about 55% by weight of acrylated epoxidized novolak, between about 5 and about 11% by weight of phenoxy resin, between about 14 and 20% by weight of nadic methyl anhydride as liquid anhydride of the carboxylic acid, between about 4 to about 5.5% by weight of colloidal silica, between about 4 and about 14% by weight of TMPTA, and between about 0.5 and about 1.5% by weight of TBA with the rest being solvent.

23. Composition according to claim 22, containing about 42% by weight of acrylated epoxidized novolak, about 8% by weight of phenoxy resin, about 15.5% by weight of nadic methyl anhydride, about 4.5% by weight of colloidal silica, about 8% by weight of TMPTA, about 1.0% by weight of TBA and about 21% by weight of solvent.

24. Method according to claim 1, wherein both sides of the printed circuit board are coated with the photopolymerizable composition by screen printing, and exposed to radiation prior to the baking step.

25. Method according to claim 1, wherein the printed circuit boards are inspected prior to the thermal cure and reclaimed in case of defective coating.

* * * * *